United States Patent [19]
Field

[11] Patent Number: 4,626,801
[45] Date of Patent: Dec. 2, 1986

[54] RELAXATION INTEGRATED CIRCUIT OSCILLATOR

[75] Inventor: Thomas L. Field, Rutland, Mass.

[73] Assignee: Sprague Electric Company, North Adams, Mass.

[21] Appl. No.: 791,480

[22] Filed: Oct. 25, 1985

[51] Int. Cl.[4] .................... H03B 5/24; H03K 3/023
[52] U.S. Cl. .................................. 331/111; 331/176
[58] Field of Search .................. 331/111, 113 R, 176, 331/143, 108 D, 108 C; 330/252, 256

[56] References Cited

U.S. PATENT DOCUMENTS 3,886,485  5/1975  Takahashi ...................... 331/111
4,434,408  2/1984  Baba et al. ...................... 331/111
4,494,088  1/1985  Gontowski, Jr. et al. ......... 331/111

FOREIGN PATENT DOCUMENTS

J59117817  12/1982  Japan .

Primary Examiner—Siegfried H. Grimm

[57] ABSTRACT

An integrated circuit relaxation oscillator having all NPN transistors includes three interconnected differential transistor pairs with an externally connected parallel R-C timing circuit. Each of the transistor pairs has a separate current source that compensates for temperature changes in the components of the corresponding transistor-pair circuits.

11 Claims, 4 Drawing Figures

RELAXATION INTEGRATED CIRCUIT OSCILLATOR

BACKGROUND OF THE INVENTION

This invention relates to an integrated circuit relaxation oscillator that is temperature compensated and capable of operating at a low supply voltage.

An oscillator providing those features has a capacitor external to the integrated circuit that is charged by a current source in the integrated circuit, and has an external resistor paralleling the external capacitor which resistor discharges the capacitor at a rate much slower than the charge rate so that the frequency of oscillation and its stability with temperature are dependent essentially only upon those two external components and the trip point levels provided by the integrated circuit.

A known circuit of this kind is shown in FIG. 1. When the supply voltage +Vcc is first applied to terminal 10 the voltage across this external capacitor 12 is zero, the voltage at terminal 14 is at +Vcc, transistor 16 is turned on and transistor 18 is held off. Transistor 20 is also held off because its base voltage is less than +Vcc which appears at the base of transistor 16. Transistor 22 is turned on establishing a current through resistors 24 and 26 that reduces the voltage at the base of transistor 20. Transistor 28 is also turned on producing a charging current 45 in the external capacitor 12. Also at that time, transistor 32 turns on and in turn activates a series of PNP current source transistors 33, 34 and 35 that constitute the oscillator load.

This particular oscillator, in fact, is in an FM-radio stereo-decoder. It oscillates at 76 KHz, synchronized with a 19 KHz stereo pilot signal being connected via transistors 37 and 34 in a phase locked loop (not shown). Frequency dividers (not shown) are driven by the PNP transistors 33, 34 and 35, one of which is in the loop.

When the voltage at terminal 14 falls to just below the base voltage of transistor 20, then it turns on and transistor 16 turns off. Transistor 28 turns off also and the charging current 45 drops to zero. Thus, the trip point for terminating the charging period is determined by the sum of the resistor values of resistors 24 and 26 and the value of the current supplied by current sources 40 and 42.

Current source 40 has a positive temperature coefficient while that of current source 42 is negative. The total current is split, a quarter of it passing through the 1X base-emitter junction of transistor 22, another quarter of it passing through the 1X transistor 32 and half of the total current (current 45) passing through the 2X transistor 28 to charge the capacitor 12.

The capacitor discharges through external resistor 44 causing the voltage at terminal 14 to rise. Meanwhile, transistors 22, 28 and 32 are off and the 4X transistor 18 is on producing a current in resistor 24 that amounts to all of the current from the current sources 40 and 42. This produces a drop across resistor 24, a small value resistor, which sets the voltage at the base of transistor 20 higher than it was during the charge period.

When the voltage at terminal 14 equals and just exceeds the voltage at the base of transistor 20, then transistor 20 turns off, transistor 16 turns on and a new charge period begins. Thus, the termination of the discharge period is determined by the value of the current produced by current sources 40 and 42 and by the value of resistor 24.

The relaxation oscillator circuit, therefore, has the advantage that the trip point voltage levels are determined essentially only by the values of the current from current sources 40 and 42 and of the resistors 24 and 26. Furthermore, this all-NPN-transistor oscillator is operational for Vcc levels as low as 1.8 volts.

However, it has been discovered that such integrated circuit oscillators tend to lock up. This apparently stems from the need to make the currents in transistors 22, 38 and 32 much larger than the discharge current through resistor 44, so that the capacitor charge rate will be faster than the discharge rate to minimize the secondary factors determining oscillation frequency and frequency dependence upon temperature. In this situation only a small fraction of the charge current 45 is enough to equal the discharge current. That charge-discharge current equality condition can freeze the voltage across the capacitor 12 and at pad 14 at the end of a discharge period when transistor 16 is turned on slightly at a base voltage insufficient to fully switch it on.

It is, therefore, an object of this invention to provide a temperature compensated relaxation oscillator that is not subject to locking up.

It is a further object of this invention to provide such an oscillator that operates at a low power supply voltage.

SUMMARY OF THE INVENTION

An integrated circuit relaxation oscillator has first and second differentially connected transistors with first and second collector resistors connected, respectively, between the collectors of the first and second transistors and a positive voltage pad. Third and fourth differentially connected transistors have base, respectively, connected to the collectors of the first and second transistors. Third and fourth collector resistors each have one end connected, respectively, to the third and fourth transistor collectors and the other end connected through a fifth resistor to the positive pad. A fifth and sixth transistor have collectors, respectively, connected to a control terminal pad and the plus terminal pad, the fifth transistor collector also being connected to the base of the second transistor. The bases of the fifth and sixth transistors are respectively connected to the fourth and third transistor collectors.

External to the integrated circuit there may be a parallel circuit consisting of a discrete capacitor and a discrete resistor connected between the plus pad and the control pad whereby the capacitor is periodically charged by the collector current of the fifth transistor and constantly shunted and discharged by the external paralleling resistor.

It is preferred that three separate current sources supply the emitters of each of the three pairs of transistors; namely, first and second, third and fourth, and the fifth and sixth. The first of these current sources has a TC such that the collector voltages of the first and second transistors are not a function of temperature. Likewise, the second current source holds constant with respect to temperature the voltage at the junction of the third, fourth and fifth resistors. The third current source can compensate the TC of the particular external capacitor that will be used.

DESCRIPTION OF THE PREFERRED EMBODIMENTS

Figure 2:
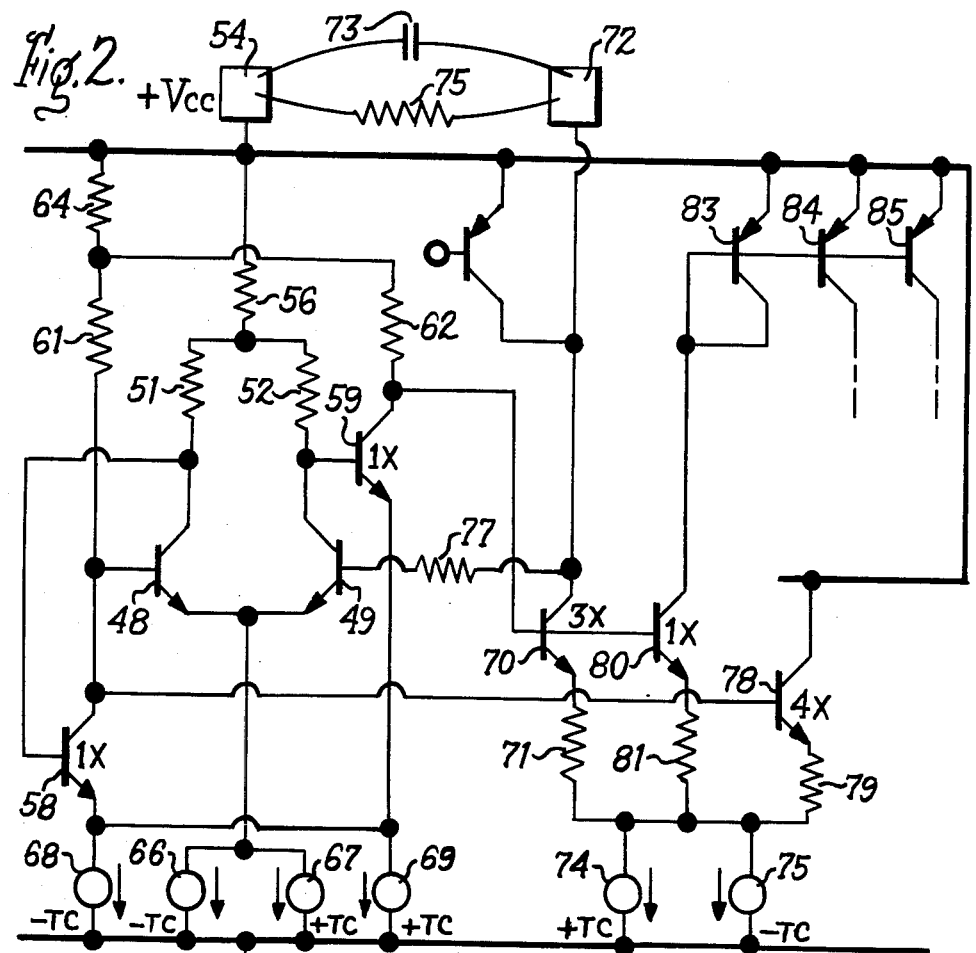
FIG. 2 shows the circuit diagram of a temperature compensated relaxation oscillator of the present invention.

Referring to FIG. 2, a pair of switching transistors 48 and 49 are differentially connected. That is, their emitters are connected to each other, and their collectors are connected through collector resistors 51 and 52, respectively, to the +DC supply terminal 54 to which a voltage +Vcc is applied. A common collector resistor 56 is, in this case, also inserted in the collector circuit.

Another pair of switching transistors 58 and 59 are also differentially connected, having bases connected, respectively, to the collectors of transistors 48 and 49. These transistors also have collector resistors 61 and 62 that are tied to the +Vcc pad 54 through resistor 64.

The first pair of transistors 48 and 49 has emitters connected to the ground pad 65 through a composite current source made up of one current source 66 having a negative temperature coefficient (−TC) of current and another and paralleling current source 67 having a positive temperature coefficient (+TC) of current. The second pair of transistors 58 and 59 has emitters connected to a composite current source made up of one current source 68 and a paralleling current source 69 having, respectively, a −TC and a +TC.

A transistor 70 has a collector tied to a voltage control terminal pad 72. A discrete capacitor 73 and a discrete resistor 75 are each connected between pads 54 and 72, so the transistor may deliver current from the third composite current source made up of current sources 74 and 75 through resistor 71 to charge the capacitor 73 and gradually drop the voltage from +Vcc at pad 72 during each capacitor charge portion of each oscillating period. Resistor 77 serves to provide some base current compensation for resistors 64 and 61 as well as some static protection at the base of transistor 49.

It will be appreciated that the above-noted lock up problem associated with oscillators of the prior art is circumvented in oscillators of this invention. The signal initiating the switching on of the capacitor-charge-current-switching transistor 70 is derived from the collector of the outer-pair differential transistor 59, and not from the collector of the inner-pair differential transistor 48 (counterpart to transistor 20 in the prior art oscillator of FIG. 1). As a result, the trip point levels are switched by outer pair transistors 58 and 59 and, also, capacitor charge current switching is effected by an outer pair transistor. Thus, the charge current switching transistor 70 is prevented from turning on until after the trip point level at the voltage divider junction of resistors 61 and 64 has begun to change and this oscillator cannot lock up.

A separate ballasting transistor 78 and emitter resistor 79 provide a path for current from current sources 74 and 75 during the discharge period of each oscillator cycle. Transistor 78 is off during the charge period but has a base-emitter area equal to those transistors drawing emitter current from current sources 74 and 75 during the charge period.

A load switching transistor 80 and emitter resistor 81 supply a current, one third that of the charge current through transistor 70, to loads comprised of PNP transistors 83, 84 and 85. Gain degenerating resistors 71 and 81 reduce the effect of current division transistors 70 and 80 that may be due to variations in transistor base-emitter area ratios from integrated circuits, piece to piece. Such emitter resistors would not be used with the equivalent transistors 28 and 32 of the prior art oscillator of FIG. 1 without also adding an emitter resistor with the outer differential pair transistor 22 since that will actually make worse there the lock up problem.

Figures 1, 4:
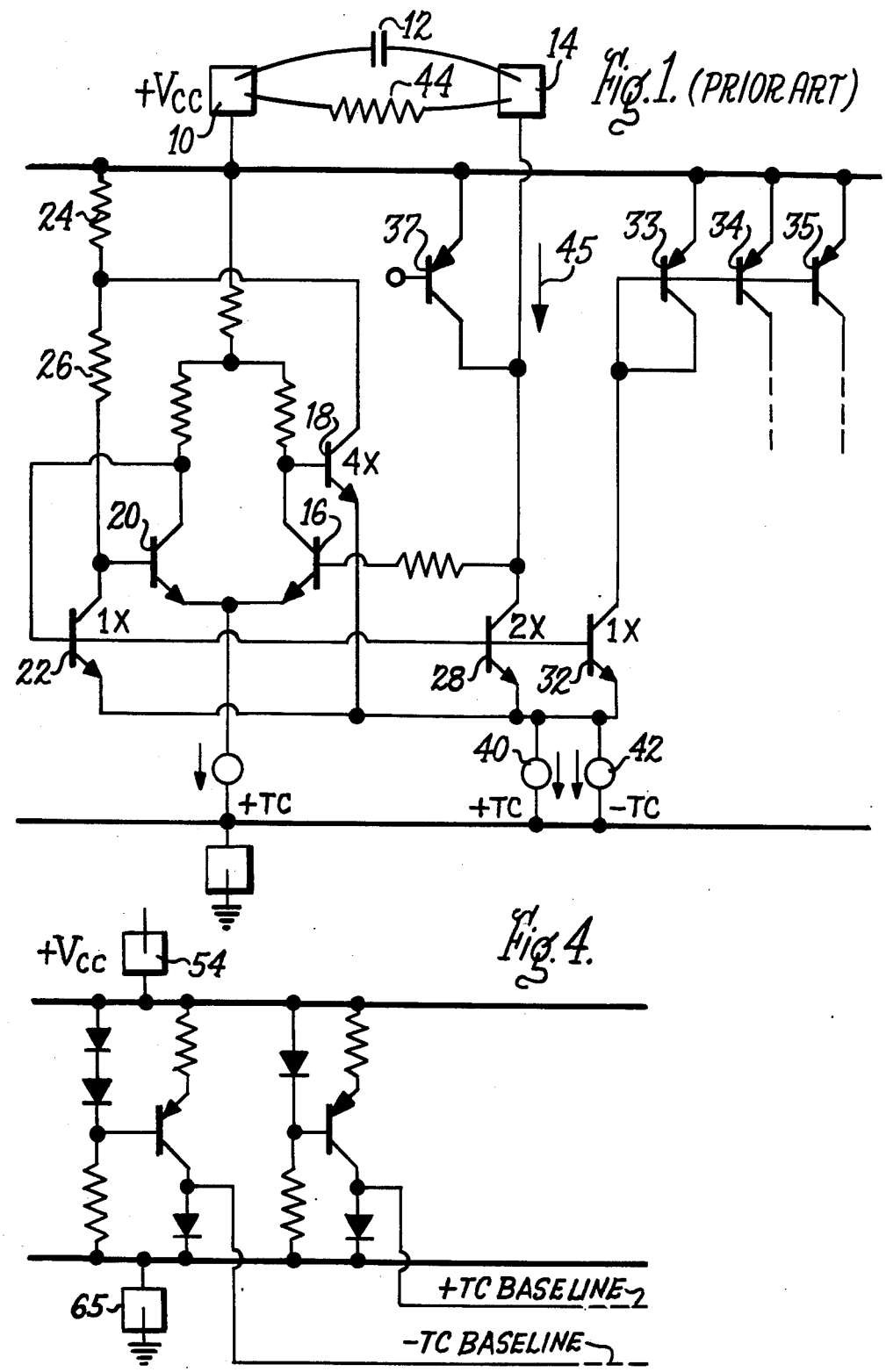
FIG. 1 shows the circuit diagram of a temperature compensated relaxation oscillator of the prior art.
FIG. 4 shows a detail of FIG. 2 including the input portions of the temperature compensated current sources.

In the prior art oscillator of FIG. 1, the ballasting function was served by the outer differential transistor 18 which was made a large 4X transistor for carrying all of the current from current sources 40 and 42. Thus, the current flow in resistors 24 and 26 through transistor 22 during the charge period is a quarter that flowing in resistor 24 during the discharge period and the value of resistor 26 must be four times larger than otherwise desirable to set the low trip point. Thus, it is much more difficult to obtain a match in temperature coefficient of resistors 24 and 26 having such disparate values (e.g., a ratio of 1/10 ohms/ohm in the old circuit). In the oscillator of FIG. 2, a separate ballasting transistor 78 is employed and another composite current source made up of sources 74 and 75 is separate from current sources 68 and 69 which supply emitter current to the outer differential transistors 58 and 59. In the later case, the ratio of values of resistors 61 and 64 may be much nearer the same (e.g., having a ratio of 1/1.7 ohms/ohm) so that better TC matching of these resistors is obtained.

Among the advantages of using three separate current sources, as in FIG. 2, is that each may provide a different degree and either polarity of temperature compensation. Here the composite current source 66+67 has a −TC compensating for the positive temperature coefficient of resistance of resistors 51, 52 and 56 to keep the voltages at the collectors invariant with temperature. Likewise, composite current source 68+69 keeps the voltage at the junction of resistors 61, 62 and 64 invariant with temperature. And the composite current source 74+75 provides a temperature variable charging current matching the temperature coefficient of capacitance anticipated to be associated with external capacitor 73 so that the charging rate is invariant with temperature.

There are numerous current source circuits providing any wanted temperature coefficient of current. It is preferred in the oscillator of this invention to employ current sources capable of operating at a low supply voltage; namely, at a voltage as low as 1.8 volts. It then becomes necessary to employ a composite current source made up of parallel current sources exhibiting a +TC and −TC, respectively.

Figure 3:
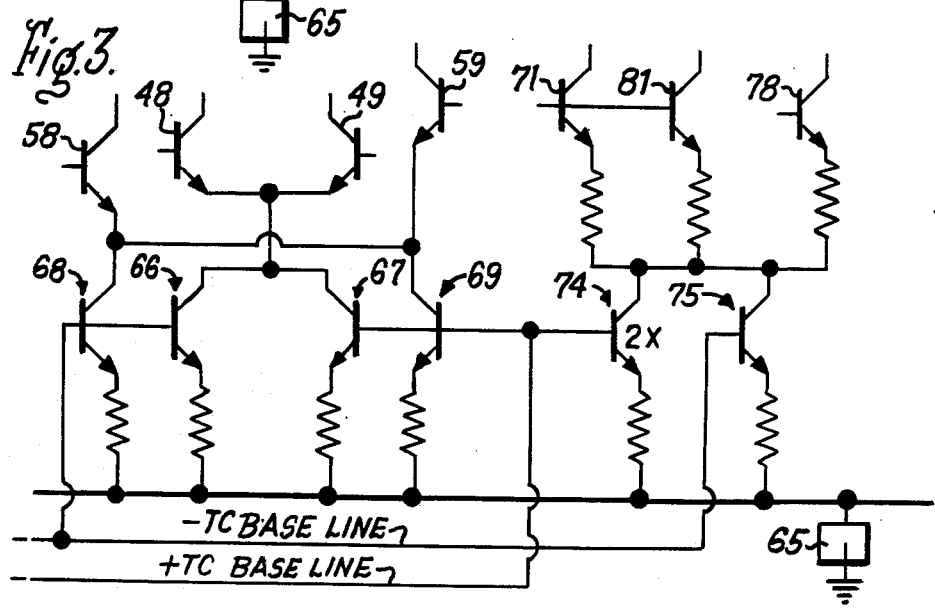
FIG. 3 shows a detail of FIG. 2 including the output mirror transistors of the temperature compensated current sources.

The circuits of the three composite current sources; i.e., 66+67, 68+69 and 74+75 that were employed in the integrated circuit oscillator of FIG. 2, are shown in FIGS. 3 and 4.

What is claimed is:

1. An integrated circuit relaxation oscillator comprising:
   (a) three terminal pads to which the positive supply voltage, a ground reference voltage and a control voltage are intended to be applied, respectively;

(b) first and second differentially connected transistors, first and second collector resistors connected between the collectors of said first and second transistors, respectively, and said positive-voltage pad;

(c) third and fourth differentially connected transistors, the bases of said third and fourth transistors being connected, respectively, to said collectors of said first and second transistors;

(d) third and fourth collector resistors being connected to the collectors, respectively, of said third and fourth transistors which resistors at their other ends are connected together;

(e) a fifth resistor connected between said positive pad and said other resistor ends;

(f) a first current source means for supplying the emitter current in said first and second transistors;

(g) a second current source means for supplying the emitter current in said third and fourth transistors;

(h) the base of said first transistor being connected to said collector of said third transistor;

(i) a fifth and sixth transistor having collectors connected, respectively, to said control terminal pad and said positive terminal pad, said fifth transistor collector also being connected to the base of said second transistor, said bases of said fifth and sixth transistors connected, respectively, to said fourth and third transistor collectors; and (j) a third current source means for supplying the emitter current in said fifth and sixth transistors, the other ends of said first, second and third current sources being connected to said ground terminal.

2. The integrated circuit oscillator of claim 1 wherein said first, second, third, fourth, fifth and sixth transistors are NPN type.

3. The integrated circuit oscillator of claim 2 additionally comprising two gain-degeneration resistors connected, respectively, from the emitters of said fifth and sixth transistors to said third current source.

4. The integrated circuit oscillator of claim 3 additionally comprising a seventh NPN transistor and an emitter resistor connected from the emitter of said seventh transistor to said third current source, said seventh transistor having a base connected to said fourth transistor collector and having a collector connected to said positive pad.

5. The integrated circuit oscillator of claim 4 additionally comprising a load in the connection between said seventh transistor collector and said positive pad.

6. The integrated circuit oscillator of claim 3 additionally comprising a discrete external capacitor connected between said positive and control terminal pads.

7. The integrated circuit oscillator of claim 6 additionally comprising a capacitor-discharge resistor connected between said positive and control terminal pads.

8. The integrated circuit oscillator of claim 6 wherein said third current source means has a temperature coefficient of current for maintaining constant at any given time during an oscillation period the charging current through said fifth transistor to said capacitor.

9. The integrated circuit oscillator of claim 3 wherein said first current source means has a temperature coefficient of current for maintaining constant at any given time during a period of oscillation the collector voltages of said first and second transistors as a function of temperature.

10. The integrated circuit oscillator of claim 3 wherein said second current source means has a temperature coefficient of current for maintaining constant at any given time during a period of oscillation the voltage at the junction of said third, fourth and fifth resistors.

11. The integrated circuit oscillator of claims 8, 9 or 10 wherein said third, first and second current source means, respectively, have a low head room requirement at their outputs which permits operation of said entire oscillator at the power supply voltage of no more than 1.8 volts.

* * * * *